United States Patent [19]

Keller et al.

[11] 4,383,177
[45] May 10, 1983

[54] MULTIPOLE IMPLANTATION-ISOTOPE SEPARATION ION BEAM SOURCE

[75] Inventors: John H. Keller, Newburgh; Charles M. McKenna, Fishkill, both of N.Y.

[73] Assignee: International Business Machines Corporation, Hopewell Junction, N.Y.

[21] Appl. No.: 219,652

[22] Filed: Dec. 24, 1980

[51] Int. Cl.³ .............................................. H01J 27/00
[52] U.S. Cl. ................................ 250/423 R; 250/427; 313/359.1
[58] Field of Search ............................ 250/423 R, 427; 313/359.1, 360.1

[56] References Cited

U.S. PATENT DOCUMENTS

| 3,178,604 | 4/1965 | Eklund ................................. 250/427 |
| 3,969,646 | 7/1976 | Reader et al. ..................... 313/359.1 |
| 4,259,145 | 3/1981 | Harper et al. ..................... 313/359.1 |
| 4,277,939 | 7/1981 | Hyman ............................... 313/360.1 |

OTHER PUBLICATIONS

"Ion Sources for Ion Machining Applications", Kaufman et al., AIAA Journal, vol. 15 No. 6, Jun. 1977, pp. 843-847.
"Characteristics of the Berkeley Multicusp Ion Source", Ehlers et al., Rev. of Sci. Ins., vol. 50, No. 11, Nov. 1979, pp. 1353-1361.
"Measurement of Spiraling in a Magnetically Confined Electron Beam for Use in Collision Studies", Taylor et al., Rev. of Scientific Ins., vol. 45, No. 4, Apr. 1974, pp. 538-544.
"Modifications of a Sputter Ion Source for Van de Graaff Operation", Hirvonen, Nuclear Inst. and Methods, vol. 116, No. 1, Mar. 1974, pp. 9-11.

Primary Examiner—Bruce C. Anderson
Attorney, Agent, or Firm—Sughrue, Mion, Zinn, Macpeak and Seas

[57] ABSTRACT

A plurality of magnetic pole pieces are arranged around the external wall of a high temperature plasma confining structure. The pole pieces are positioned between permanent magnets spaced from one another and the confining structure by distances calculated to produce a minimum field toward the center of the structure with an effective containing field around the periphery of the structure. The magnets and the pole pieces are cooled. An odd number of poles are employed such that the missing pole appears as a virtual pole at the extraction slit used for forming an ion beam for ion implantation. The resulting small package multipole plasma containment functions to provide higher beam current, longer source lifetime, higher voltage stability and reduces maintenance and cleaning operations, with the permanent magnets protected from high temperature and corrosive gases.

9 Claims, 2 Drawing Figures

MULTIPOLE IMPLANTATION-ISOTOPE SEPARATION ION BEAM SOURCE

FIELD OF THE INVENTION

This invention relates to electron-bombardment ion beam sources, and more particularly, to a multipole plasma containment structure as an element thereof.

BACKGROUND OF THE INVENTION

Electron-bombardment ion beam sources have been employed in sputter machining to selectively remove material from non-protected portions of a target substrate and in sputter deposition wherein portions of a substrate are masked to selectively deposit sputter material by ion beam bombardment in accordance with a predetermined pattern. Further, such ion beam sources have been employed in the implantation or doping of ions into a semiconductor material. In the case of the latter, higher ion energy is a requisite if useful penetration depths are achieved for the doping material.

Basically, all electron-bombardment ion beam sources require a chamber into which an ionizable material (generally in vapor form) such as argon, arsenic etc. is introduced. The chamber bears both an anode and a cathode, with the anode attracting high velocity electrons from the cathode. The impingement of electrons upon atoms (molecules) of the introduced vapor results in the ionization of the atoms (molecules). Typically at one end of the chamber, there is provided an apertured electrode followed by an apertured extraction electrode and a potential is impressed upon the latter electrode which accelerates the ions out of the chamber through the apertures in both electrodes.

Further, the interior of the chamber is subjected to a magnetic field to effect gyration of the electrons in their travel towards the anode, thus greatly increasing the chance of an ionizing collision between any given electron and one of the source material atoms. This results in an increased efficiency in ionization.

Typically, ion sources for isotope separators and implantation systems have used solenoid magnetic fields for increasing the plasma density and gas efficiency by increasing the path length of the ionizing electrons between the cathode and anode. However, as this solenoid field is increased, the plasma constricts, becomes noisy, and the helical instability limits the regime of effectiveness of the magnetic field.

Recent efforts have shown that a quiescent plasma may be obtained by using a multipole containment of the ionizing electrons. U.S. Pat. No. 3,969,646 to Reader et al., issued July 13, 1976, teaches the use of a multipole configuration wherein a plurality of successively-spaced segments of electrically-conductive magnetic material are distributed within the chamber, the segments being interconnected with a potential impressing means so that the segments collectively constitute the anode. Further, individually adjacent segments are respectively polarized oppositely in a magnetic sense so that segments collectively establish the magnetic field. In one specific structural assembly, each of the anode segments is composed of a strip of magnetizable material and each successive pair of such strips are spaced apart by respective individual magnets.

Ion sources used for high current in implantation and isotope separation generally operate at higher current densities, higher source temperatures ($\sim 1000°$ C.) and higher extraction voltages than existing steady state sources using multipole configurations. For operation at high voltage, a source should operate at high efficiency to reduce the pressure in the extraction region which may lead to voltage breakdown. In particular, isotope separation requires high efficiency to minimize material losses to the vacuum system. Higher efficiencies are usually obtained by operation at higher plasma densities and hence higher source temperatures. Higher plasma densities can be achieved more easily in a small source geometry for a given cathode emission. Furthermore, a small source geometry is desired to achieve adequate high voltage isolation without extensive consumption of space.

Such multipole sources as found in the prior art are generally large area multi-aperture sources in which the ratio of the low ($<100$ Gauss) intensity magnetic field region to high intensity magnetic field region is reasonably large. The region of low magnetic field intensity corresponds to the region of quiescent plasma formation during source operation. When constrained to small volumes, commercially available sources do not assume multipole configurations due to the difficulty in achieving a reasonable region of low magnetic field intensity and also in extracting an ion beam in the presence of the high magnetic fields desired at the walls. Furthermore, the high source temperatures resulting from operation at high plasma densities are not compatible with most permanent magnets which tend to lose field strength when heated.

Nevertheless, applicants have determined that a multipole source configuration has certain properties which are advantageous for the high voltage, high efficiency operation of ion implantation or isotope separation sources. Multipole configurations reduce the ionizing electron losses which improves the source efficiency for a given cathode emission level, which would lead to longer cathode lifetimes. Also, since it is extracted from a quiescent plasma, the ion beam from a multipole source will be less noisy and less likely to strike electrodes, producing secondary electrons which can lead to arcing. Furthermore, it has been determined that the presence of magnetic fields in the extraction gap (such as occurs in standard solenoidal field configurations) leads to increased probability of ionization of residual gases by secondary electrons, which enhances conditions for voltage breakdown. The multipole configuration minimizes the level of magnetic fields in the extraction region.

Typically, multipole sources are large broad beam, multi-aperture sources. However, in ion implantation and isotope separation, one wants to achieve both high beam current density and reasonable (50 hours or more) filament lifetime. Of necessity, such a source is one in which the plasma volume is considerably smaller than prior art multipole sources and one which operates in the 1000° C. temperature range.

Accordingly, it is an object of the present invention to provide an ion implantation and isotope separation ion source which will operate at high temperature and high plasma density while maintaining 50 hours or more filament lifetime.

It is a further object of the invention to provide a quiescent plasma ion source compatable with high extraction voltages (80 kilovolts or more).

SUMMARY OF THE INVENTION

The present invention is directed to a highly effective multipole type implantation-isotope separation ion beam source of the multipole plasma containment type and comprises a high temperature plasma confining structure having a plurality of magnetic poles arranged about the external walls of the confining structure. The present invention provides a small structure for ion implantation having high voltage compatibility (i.e. no strong external magnetic field to increase electron path leading to ionization and breakdown). Further, a plurality of permanent magnets are provided which individually separate pairs of the plurality of magnetic poles or pole pieces with the magnetic poles being separated from one another and the confining structure by a distance so as to produce a minimum field toward the center of the confining structure and with an effective containing field around the periphery of the confining structure. Further, means are provided to cool the magnetic poles and permanent magnets. Preferably, the plurality of magnetic poles constitutes an odd number to create a virtual pole (for the missing even pole) at the extraction slit to enhance plasma presence at extraction slit.

DESCRIPTION OF THE PREFERRED EMBODIMENT

Figure 1:
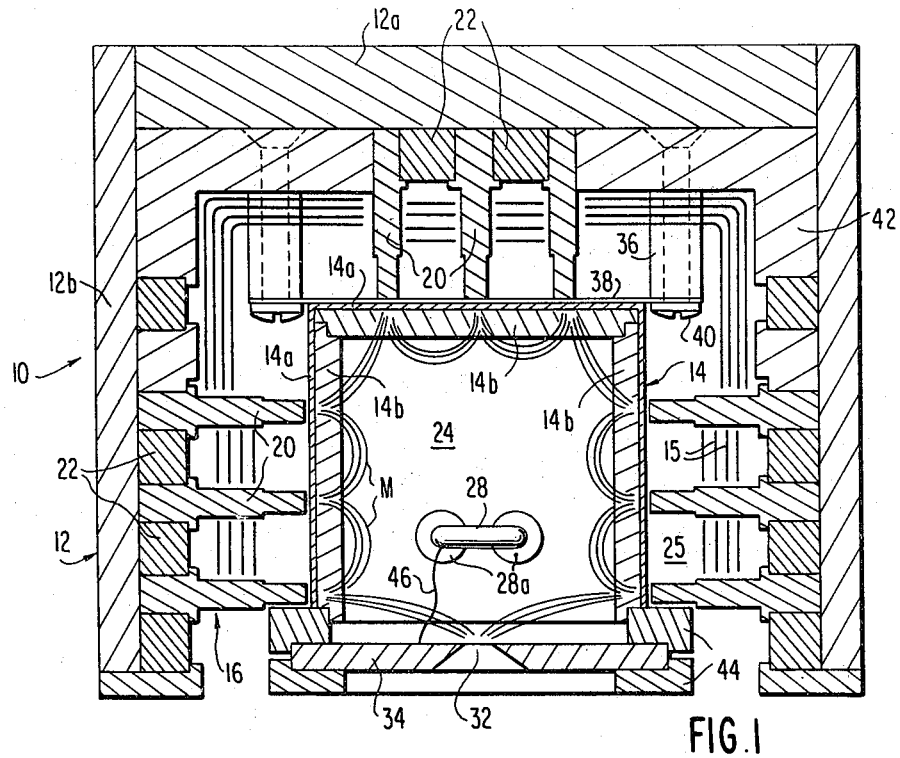
FIG. 1 is a cross-section of one embodiment of the improved multipole ion beam source of the present invention.

In the illustrated embodiments of the invention, like elements bear like numerical designations. Referring to FIG. 1, one embodiment of the multipole containment ion beam source is indicated generally at 10 and takes the form of a rectangular box assembly including an outer box indicated generally at 12, being open ended and formed of copper sheet material including a back wall 12a and laterally opposed side walls 12b. The back wall 12a may include a liquid refrigerant circulation loop connected to a standard refrigeration circuit (not shown) such that an appropriate refrigerant such as "Freon 13" may be circulated through the back 12a of the block to remove the source heat. The ends of copper side walls 12b abut opposite ends of the back wall 12a and readily transmit heat by conduction to the back wall 12a where it is removed by the refrigerant. Within the outer box 12 is disposed an inner, open ended, heat shield box indicated generally at 14, defining internally, an arc chamber 24. As illustrated, in this embodiment, the heat shield box 14 comprises relatively thin sheets of molybdenum as at 14a and bearing on their internal faces relatively thick layers of graphite as at 14b. Heat shield box 14 comprises a high temperature plasma confining structure formed of one or more materials such as graphite, tungsten, molybdenum, tantalum, etc. The heat shield box 14 is physically mounted to the outer box 12 by way of spacers 36 across which spans a mounting plate 38 to which a molybdenum sheet 14a is affixed; the spacers 36 being mounted to the outer box 14 by way of bolts or screws 40 which pass through soft iron yokes 42 to each side of the assembly. The soft iron yokes 42 form part of the magnetic circuit structure.

The graphite layers 14b may alternatively be formed of tantalum.

Surrounding the inner box 14 and confined by the outer box 12 is a multipole magnet assembly indicated generally at 16 and comprised of a plurality of spaced, open framed poles or pole pieces 20, between which are sandwiched a plurality of aligned permanent magnets 22 separated by the pole pieces and additionally by the soft ion yokes 42 at the internal corners of the box assembly. The pole pieces 20 constitutes an odd number in the instant embodiment; three to each side and three to the back of the magnet assembly 16. The magnetic poles are preferably of an odd number, nine being shown in the embodiment of FIG. 1, although the number of poles could be five or three, for example. These odd number poles complete the field around the wall of the arc chamber 24 formed by the heat shield box 14. In a typical manner, a loop filament 28, positioned within chamber 24 and borne by boron nitride insulators 28a, functions as the cathode, the graphite layer 14b functioning as the anode and the anode and cathode being subjected to a particular electric potential difference. In that respect, the cathode is connected by way of leads which project through the graphite layer 14b of the heat shield box 14. A plurality of spaced molybdenum heat shield foils 15 are employed within vacuum space 25 through which project the pole pieces 20. The alternating pole arrangement for the permanent magnets 22 is as shown. The pole pieces 20 may be formed of Ni steel for example.

To complete the assembly and for ion implantation application, an ion beam is extracted from the source via an aperture or slit 32 within a cover plate 34, also formed of graphite and overlying the open end of the heat shield box 14. Boron nitride insulators 44 function to electrically isolate the graphite cover plate bearing the extraction slit 32 from the rest of the assembly and particularly to permit the cover plate 34 to be maintained at an electrical potential which is more negative than that of the anode and preferably at least as negative as that of the cathode during operation of the source. In that respect, schematically, the filament 28 is shown being electrically connected via conductor 46 to the graphite cover plate 34. As may be appreciated, the assembly is completed by top and bottom walls corresponding to the illustrated portion of the structure of the outer box 12 and inner box 14a, respectively. If the multipole magnetic structure does not extend around the top and bottom surfaces, then these surfaces should be insulated or be isolated from the side walls and biased at or near cathode potential.

Tests have shown that the confinement time for an ion beam source, such as that at 10 in the drawing, is greater than that observed in a solenoid type source. This is contrary to simple plasma theory where one would expect the confinement time to be longer in the solenoid type source. However, such solenoid type source becomes noisy at low pressure and high magnetic field, and the noise in turn causes enhanced diffusion of the electrons to the arc chamber walls.

Applicants have determined that in order to cause the ions to flow to the extractor in such a source, while the slit 32 should appear to be one of the magnet poles, since a pole face cannot be placed at that location, the source is required to have an odd number of poles (ferromagnetic pole faces) with the missing pole appearing to be at the slit. The slit region constitutes a virtual pole but of lower magnetic field strength in the embodiment illustrated in FIG. 1.

The magnetic field distribution M closely hugs the interior graphite layers 14b, that is, the interior wall of the heat shield box 14 for effective operation in the manner described previously.

While the source temperature increases and thus there is an increase in the percentage of As$_2$ versus As$_4$ vapour in the source 10 with increased efficiency in the production of the As+ beam, an aspect of the present invention lies in the source 10 being provided with a heat shield inner box 14 forming the chamber 24 of high temperature material such as graphite or tantalum, this being required to adequately protect the permanent magnets 22. Thus, the design of the magnetic poles, their orientation and the cooling thereof is critical, all of these aspects being provided for within the embodiments of the present invention.

The ion beam sources are particularly applicable to mass separation and implantation, highly useful in the semiconductor industry. Where the ion beam source runs on arsenic, the arsenic load is deemed to last longer, the beam line and beam line components remain cleaner, and the pumping requirements of the ion beam source are effectively reduced. Through the utilization of longer confinement times and path lengths of the ionizing electrons with the multipole field source as illustrated, as compared to a conventional solenoid field type, this permits the cathode 28 to operate at a lower discharge current and results in longer filament lifetime.

Further, it is believed that the ion beam source 10 permits an ease of obtaining boron from boron trifluoride when such is used as the plasma base.

Figure 2:
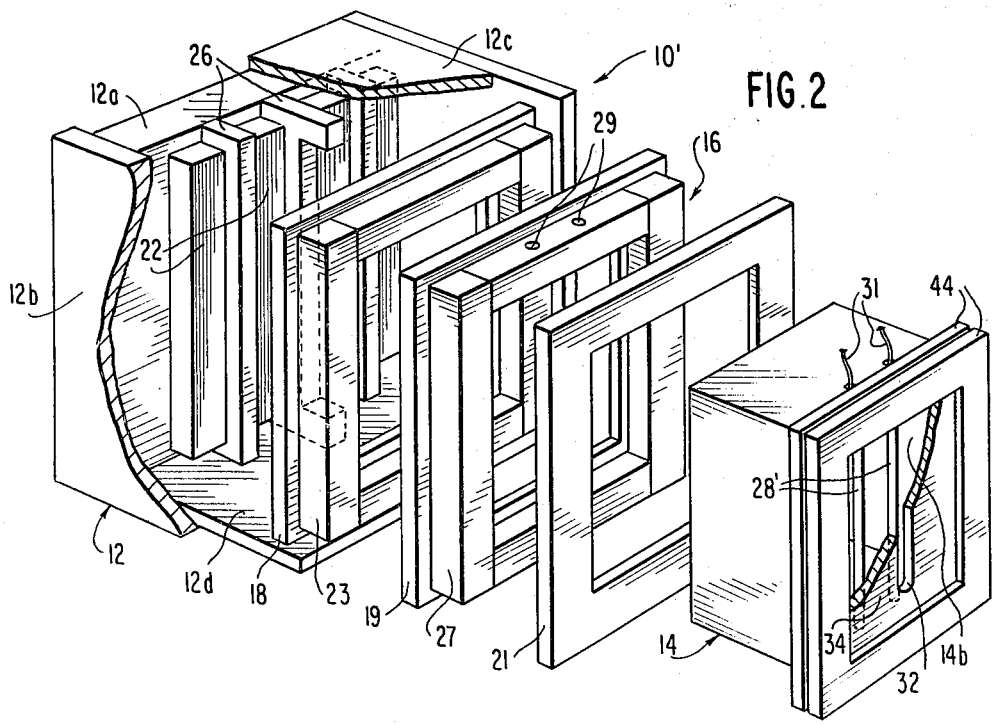
FIG. 2 is an exploded, perspective view of a second embodiment of the invention.

FIG. 2 shows such a source configuration 10' which is preferred for the operation with BF$_3$ for producing B+. Reference to FIG. 2 shows a source configuration wherein source 10' is in many ways similar in construction and operation to that of the first embodiment. The principal difference resides in the utilization of two filaments as at 28' which consist of two straight rods oriented parallel to the aperture slit 32 in cover plate 34 which overlies the open end of the inner shield box 14. This configuration produces less stress related area over that of the embodiment illustrated in FIG. 1 wherein the filament is essentially a short loop filament projecting internally of the arc chamber 24.

In other respects, the multipole containment ion beam source 10' constitutes a rectangular box assembly including in addition to the inner, open ended heat shield box 14, the outer box 12. The heat shield box 14 is constructed similarly to that of the first embodiment and preferably comprises an inner layer of graphite or tantalum. Additionally and in the manner of the prior embodiment, surrounding the inner box 14 and confined by the outer box 12 is a multipole magnet assembly indicated generally at 16. Spaced, open frame pole pieces 18, 19 and 21 support a plurality of bar magnets 22 of rectangular cross-section. Additionally, three pole pieces as at 26 are separated by additional bar magnets, at the rear or back of the assembly. Thus, as may be appreciated, on each side of the chamber 24 are provided three pole pieces (18, 19, 21) and at the rear an array of three pole pieces 26 of appropriate magnetic polarization as shown, forming an odd number of magnetic poles, with the virtual pole corresponding to slit 32 in the manner of the prior described embodiment. In the exploded, perspective view of FIG. 2, the nature of the electrical insulation of the graphite cover plate 34 and the electrical connection between filaments 28' and that cover plate is as shown, and may be accomplished in the manner of the embodiment of FIG. 1. Again, the graphite layer for the inner heat shield box 14 may preferably form the anode for the source 10'.

As may be appreciated, the pole pieces 18, 19 and 21 are of the so-called "picture frame" type formed of a magnetic material with bar magnets 23 and 27 also being of open frame, rectangular form, and being comprised of vertical and horizontal sections. In that respect, bar magnet 27 carries holes as at 29 drilled therein through which pass leads 31 connected to the rod filaments 28', the leads 31 being appropriately electrically insulated from the bar magnet 27. In the embodiment of FIG. 1, bar magnets and magnetic pole pieces may extend across the bottom of inner box 14 while in FIG. 2 the bar magnets and their magnetic field pole structure completely surrounds all of the walls of the inner box 14, with the exception of cover 34, wherein the virtual pole is formed. As may be appreciated, structural aspects found in the embodiment of FIG. 2 may be incorporated within the structure of FIG. 1 and vice versa. For instance, the back wall 12a of the outer box 12 may be cooled in the same manner as that described in conjunction with source 10, FIG. 1. Further, while top and bottom walls 12c and 12d are partially illustrated in FIG. 2 with respect to the outer box 12 in that embodiment, these walls are not shown in the embodiment of FIG. 1, although they may be incorporated therein as desired.

While the invention has been particularly shown and described with reference to a preferred embodiment thereof, it will be understood by those skilled in the art that various changes in form and details may be made therein without departing from the spirit and scope of the invention.

We claim:

1. A compact, high temperatures multipole plasma containment ion beam source comprising:
    an outer box formed of heat conductive metal and constituting a heat sink cooling block;
    an inner, open ended box constituting a high temperature plasma confining structure;
    spacer means for mounting said inner box spaced from said outer box;
    a cathode and an anode within said inner box;
    a plurality of magnetic pole pieces mounted within said outer box and projecting from said outer box towards said inner box;
    a plurality of permanent magnets, individual ones of said permanent magnets being positioned between given magnetic pole pieces to separate pairs of said plurality of magnetic pole pieces such that said magnetic pole pieces are separated from one another and from said confining structure by distances such that a minimum magnetic field is produced toward the center of the confining structure and an effective containment field is produced around the periphery of said confining structure permitting said ion beam source to operate at high beam current intensity and high plasma density with generated heat reaching the permanent magnets being rapidly conducted therefrom by said outer box housing said magnetic pole pieces and said permanent magnets for cooling the same.

2. The ion beam source as claimed in claim 1, wherein said plurality of magnetic pole pieces comprise an odd number, and wherein said ion beam source further comprises a cover plate bearing an extraction slit for ion implant use, and wherein a missing even magnetic pole appears as a virtual pole at said extraction slit.

3. The ion beam source as claimed in claim 1, wherein said high temperature plasma confining inner box is formed of one material from the group consisting of graphite, tungsten, molybdenum and tantalum.

4. The ion beam source as claimed in claim 3, wherein said high temperature plasma confining structure comprising an inner open ended box is formed of graphite, a thin planar graphite cover overlies the open end of said inner box and bears an extraction slit for ion implant use, a heat shield material is interposed between said inner and outer boxes, and wherein said plurality of magnetic pole pieces comprise rectangular open frame magnetic pole pieces projecting from said cooling block through said heat shield material to said inner graphite box and wherein said plurality of permanent magnets are mounted in a peripheral array in contact with and between ends of said rectangular open frame pole pieces projecting inwardly from said outer box and between said heat shield material and said outer box.

5. The ion beam source as claimed in claim 4, further comprising means for holding the extraction slit cover at a voltage which is more negative than the anode, during operation of the source.

6. The ion beam source as claimed in claim 5, further comprising means for holding the extraction slit cover at a voltage which is at least as negative as the cathode during operation of the source.

7. The ion beam source as claimed in claim 1, wherein at least a part of the plasma confining structure forms said anode.

8. The ion beam source as claimed in claim 2 further comprising means for holding said extraction slit cover at voltage which is more negative than that of the anode.

9. The ion beam source as claimed in claim 8, further comprising means for holding the extraction slit cover at a voltage which is at least as negative as that of the cathode.

* * * * *